US009653455B1

(12) United States Patent
Coyne

(10) Patent No.: US 9,653,455 B1
(45) Date of Patent: May 16, 2017

(54) FET—BIPOLAR TRANSISTOR COMBINATION

(71) Applicant: Analog Devices Global, Hamilton (BM)

(72) Inventor: Edward John Coyne, Athenry (IE)

(73) Assignee: Analog Devices Global, Hamilton (BM)

(*) Notice: Subject to any disclaimer, the term of this patent is extended or adjusted under 35 U.S.C. 154(b) by 0 days.

(21) Appl. No.: 14/937,627

(22) Filed: Nov. 10, 2015

(51) Int. Cl.
H01L 27/06 (2006.01)
H01L 29/08 (2006.01)
H01L 29/73 (2006.01)
H01L 29/78 (2006.01)
H01L 29/417 (2006.01)
H01L 29/66 (2006.01)
H01L 21/8234 (2006.01)

(52) U.S. Cl.
CPC .. H01L 27/0623 (2013.01); H01L 21/823475 (2013.01); H01L 29/0804 (2013.01); H01L 29/0821 (2013.01); H01L 29/41741 (2013.01); H01L 29/41766 (2013.01); H01L 29/66234 (2013.01); H01L 29/66666 (2013.01); H01L 29/7302 (2013.01); H01L 29/7827 (2013.01)

(58) Field of Classification Search
CPC ............. H01L 27/0623; H01L 29/0821; H01L 29/66234; H01L 29/41741; H01L 21/823475; H01L 29/41766; H01L 29/7302; H01L 29/66666; H01L 29/0804; H01L 29/7827

USPC ......................................................... 257/378
See application file for complete search history.

(56) References Cited

U.S. PATENT DOCUMENTS

| 5,659,190 | A  | * | 8/1997  | Litwin ............... H01L 27/0716 257/273 |
| 6,015,982 | A  | * | 1/2000  | Soderbarg .......... H01L 27/0722 257/262 |
| 8,736,343 | B2 |   | 5/2014  | Chen et al. |
| 9,209,091 | B1 |   | 12/2015 | Harper et al. |
| 2003/0160281 | A1 |   | 8/2003  | Chen |
| 2005/0067630 | A1 |   | 3/2005  | Zhao |
| 2011/0101417 | A1 |   | 5/2011  | Ogura et al. |
| 2015/0021682 | A1 |   | 1/2015  | Bobde et al. |

FOREIGN PATENT DOCUMENTS

EP 2996246 3/2016
WO WO 01/61951 8/2001

OTHER PUBLICATIONS

Vincent, et al., "V-JFET Transistors for over voltage protection in power device series connected applications," Proceedings of the 18th International Symposium on Power Semiconductor Devices & IC's Jun. 4-8, 2006 Naples, Italy, 4 pages.

* cited by examiner

Primary Examiner — Fernando L Toledo
Assistant Examiner — Adam S Bowen
(74) Attorney, Agent, or Firm — Knobbe, Martens, Olson & Bear, LLP

(57) ABSTRACT

A transistor switch device is provided that exhibits relatively good voltage capability and relatively easy drive requirements to turn the device on and off. This can reduce transient drive current flows that may perturb other components.

21 Claims, 15 Drawing Sheets

FET—BIPOLAR TRANSISTOR COMBINATION

BACKGROUND

Technical Field

The present disclosure relates to a combination of a field effect transistor and a bipolar transistor.

Description of the Related Technology

There is often a need to be able to switch relatively high voltages, typically up to and in the 200 Volt to 300 Volt range. Transistors to achieve this may be integrated into an integrated circuit package with lower voltage processing and control circuits. In many instances it is convenient and cost effective for such high voltage transistors to be on the same wafer as the lower voltage control circuits. As a result it can be highly desirable for all of the connections to such a high voltage transistor to be made on the same side of the wafer. Applications for switches in this voltage range include motor control and inverters, light dimmers, automotive switches where transient voltages due to inductive loads may potentially occur and a whole host of mains voltage related switching in industrial and domestic appliances and power supplies for such appliances.

Switching can often be done by high power metal oxide semiconductor field effect transistors (MOSFETS) and the like. However it is often desirable for the drive loading presented by such a transistor to be as small as possible, and this tends to be a problem with relatively large MOSFETS as although they take no substantial gate current under conditions when the gate is being held at a constant voltage, the gate has a relatively large capacitance and hence current flows to and from the gate during transistor switching may result in large transient current flows that may perturb the operation of other circuits or induce noise in them by virtue of supply rail voltage fluctuations that such large current flows can induce.

Other considerations also become a factor when choosing a switching technology. The high voltage MOSFETs (e.g., double-diffused metal oxide semiconductor (DMOS) transistors) generally have a competitive advantage over insulated gate bipolar transistors (IGBT) in the lower voltage switching ranges, with IGBTs becoming favoured as the voltage increases past 700 V to 800 V or so.

SUMMARY OF CERTAIN INVENTIVE ASPECTS

According to a first aspect of this disclosure, there is provided a current flow control device, comprising a bipolar transistor in combination with a field effect transistor inside an isolated region of semiconductor. A first region of semiconductor is shared by the bipolar transistor and the field effect transistor.

Such an arrangement can allow the field effect transistor to be responsible for bearing most of the voltage drop across the current flow control device in an off state. This can in turn allow the bipolar transistor to be formed in a higher gain configuration than is found in certain prior IGBTs. This can in turn reduce the size of the drive current for the bipolar transistor. Preferably the bipolar transistor is an NPN transistor as these tend to exhibit higher gain than PNP transistors.

This in turn means that a smaller drive transistor can be used to provide the base current for the bipolar transistor. Accordingly, the parasitic capacitance at an input node of the drive transistor can be much reduced, leading to smaller transient currents. Furthermore all of the connections to the device can be made on one side of the wafer in which the device is fabricated. This can facilitate integration of the device with other components in an integrated circuit as the connections can be made using commonly available fabrication process such as standard complementary metal oxide semiconductor (CMOS) processes, and hence additional non-standard processing steps can be avoided. Extra steps typically increase cost and reduce yield.

The structure presented herein can compete with MOSFET/DMOS devices for switching tasks. The device resistance according to certain embodiments is lower for a given device size relative to some previous devices, because the emitter current is conducted vertically over substantially the entire area of the emitter rather than through a narrow horizontal channel of a MOSFET. Furthermore the layout area, and hence silicon real-estate cost, can be reduced because the portion of the device that acts as a "hold off" region is vertically formed in devices constituting embodiments of this disclosure rather than laterally as in the case of a typical DMOS device.

According to a second aspect of this disclosure, there is provided an integrated circuit including at least one current control device according to a first aspect of this disclosure.

According to a third aspect of this disclosure, there is provided a method of forming a current control device, the method comprising forming a first region of semiconductor within an isolated well, the first region being a first type doping region having a first doping concentration; forming a second region abutting the first region, the second region being the first type doping region having a second doping concentration less than the first doping concentration; forming a third region abutting the second region, the third region being a second type doping region; forming a fourth region abutting the third region, the fourth region being more highly doped than the third region and being the first type doping region; and where current flow nodes are in current flow communication with the first and fourth regions, and where current flow between the third and fourth regions controls current flow between the first and fourth regions.

BRIEF DESCRIPTION OF THE DRAWINGS

The teachings of the present disclosure will be described, by way of non-limiting example, with reference to some embodiments of those teachings in conjunction with the accompanying Figures in which.

DETAILED DESCRIPTION OF CERTAIN EMBODIMENTS

Figure 1:
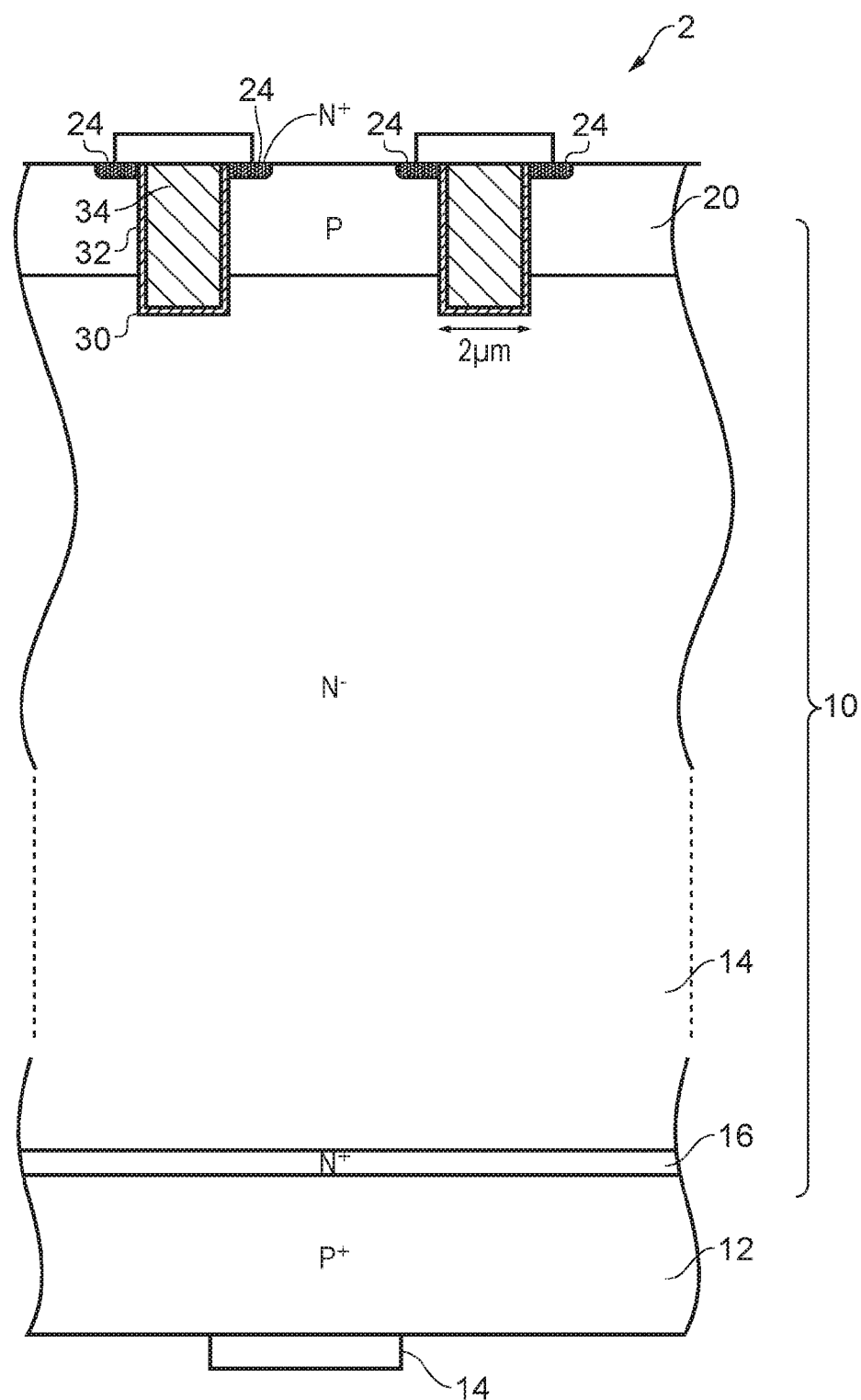
FIG. 1 is a cross section through a prior art vertical IGBT for the purposes of placing the present teachings in context.

The following detailed description of certain embodiments presents various descriptions of specific embodiments. However, the innovations described herein can be embodied in a multitude of different ways, for example, as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Some transistor structures are shown in the Figures. Various regions of different doping concentrations and dopant types are shown in the Figures and are denoted by boundary lines for diagrammatic convenience. It should be appreciated that due to the doping techniques used the boundaries may be diffuse regions.

FIG. 1 schematically illustrates the configuration of a prior art vertical insulated gate bipolar transistor IGBT 2. Forming the transistor vertically reduces its footprint on the wafer and hence the cost of the transistor, although this does come with the inconvenience of having to make a contact to the back of the wafer. The transistor shown in FIG. 1 comprises a handle wafer 12 which is P type doped and to which a metal contact 14 is made. An N type region 14 of semiconductor is provided over the P type handle wafer 12. The region 14 is often grown by epitaxial deposition and may be relatively thick, often over 100 microns thick in high voltage devices. The region 14 is often relatively lightly doped and is designated N⁻ in FIG. 1 whereas the region 12 is quite heavily doped and is designated P⁺. Often a region 16 is formed between the P⁺ handle wafer 12 and the N⁻ epitaxial layer 14 and is more highly N type doped that the region 14. This layer 16 helps prevent punch through. A P⁺ region 20 is formed over the N⁻ epitaxial layer. Thus the structure is that of a vertical PNP transistor 10.

The large depth of region 14, which forms the base of the transistor gives the transistor the ability to withstand high potential differences between the layer 12, which forms an emitter, and the layer 20 which forms the collector. The maximum voltage that the device can stand scales substantially linearly with the thickness of the base layer. However a thick base region also tends to give rise to a low current gain, with the current gain β often being close to unity. Thus the high voltage PNP transistor shown in FIG. 1 has the advantage of being able to act as a switch and withstand high voltages, but the penalty that it incurs is a large base current if it is desired to pass a large collector current.

Figure 2:
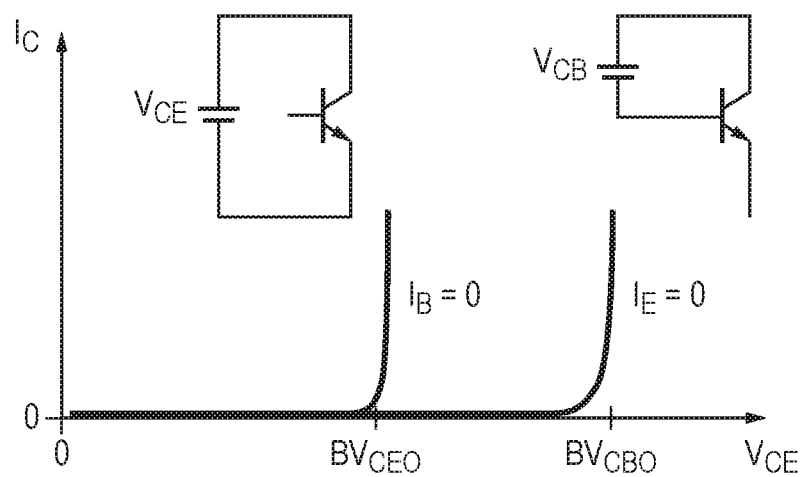
FIG. 2 shows the circuit configurations used to characterize $BV_{CE0}$ and $BV_{CBO}$ for bipolar transistors.

It is known from the literature relating to bipolar transistors that the transistor breakdown voltage $BV_{CEO}$ which is the collector to emitter breakdown voltage with the base open is related to $BV_{CBO}$, which is the collector to base breakdown voltage of a common emitter transistor with the emitter floating. The relative circuit configurations and breakdown voltages are shown in FIG. 2. The relationship between $BV_{CEO}$ and $BV_{CBO}$ is given by the following $$BV_{CEO}=BV_{CBO}/(1/\beta)^{\hat{}}(1/m) \qquad \text{Eqn. 1}$$

Where β=current gain and
m=4 for NPN and 2 for PNP silicon transistors.

Thus the designer of high voltage transistors understands that for good breakdown performance a low gain is highly desirable.

In order to address this problem of low current gain a field effect transistor, FET, is provided to drive the base current. The FET could be provided as a separate device. However a more compact implementation is to provide it within the collector region of the PNP transistor. The user now only has to drive the load presented by the gate of the drive FET rather than supply the current required by the low gain bipolar transistor. The FET can be provided such that an N type drain region of the FET is formed by the N type region 14 of the PNP bipolar transistor. An N type doping 24 (FIG. 1) is provided in part of the P type layer 20 so as to form a source terminal of the FET. In order to form a gate, a trench 30 is formed that extends from the surface of the device to the N⁻ layer 14. The trench is lined by a dielectric 32 such as oxide, nitride or polyamide, and the trench is then filled with a conductive material 34 to form a gate electrode. The conductive material 34 may, for example, be a metal or doped polysilicon.

The regions 24 are in contact with the material 20 forming the collector of the PNP transistor and can take current from the surface of layer 20 and, by virtue of the voltage of the gate depleting the P type material adjacent the insulator 32 and thereby forming a N type channel adjacent the insulator 32, current can be supplied to the base region to turn the bipolar transistor on. A metal contact may be made between the regions 24 and the collector region 20 to ensure the FET has reliable contact with the collector region.

Figure 3:
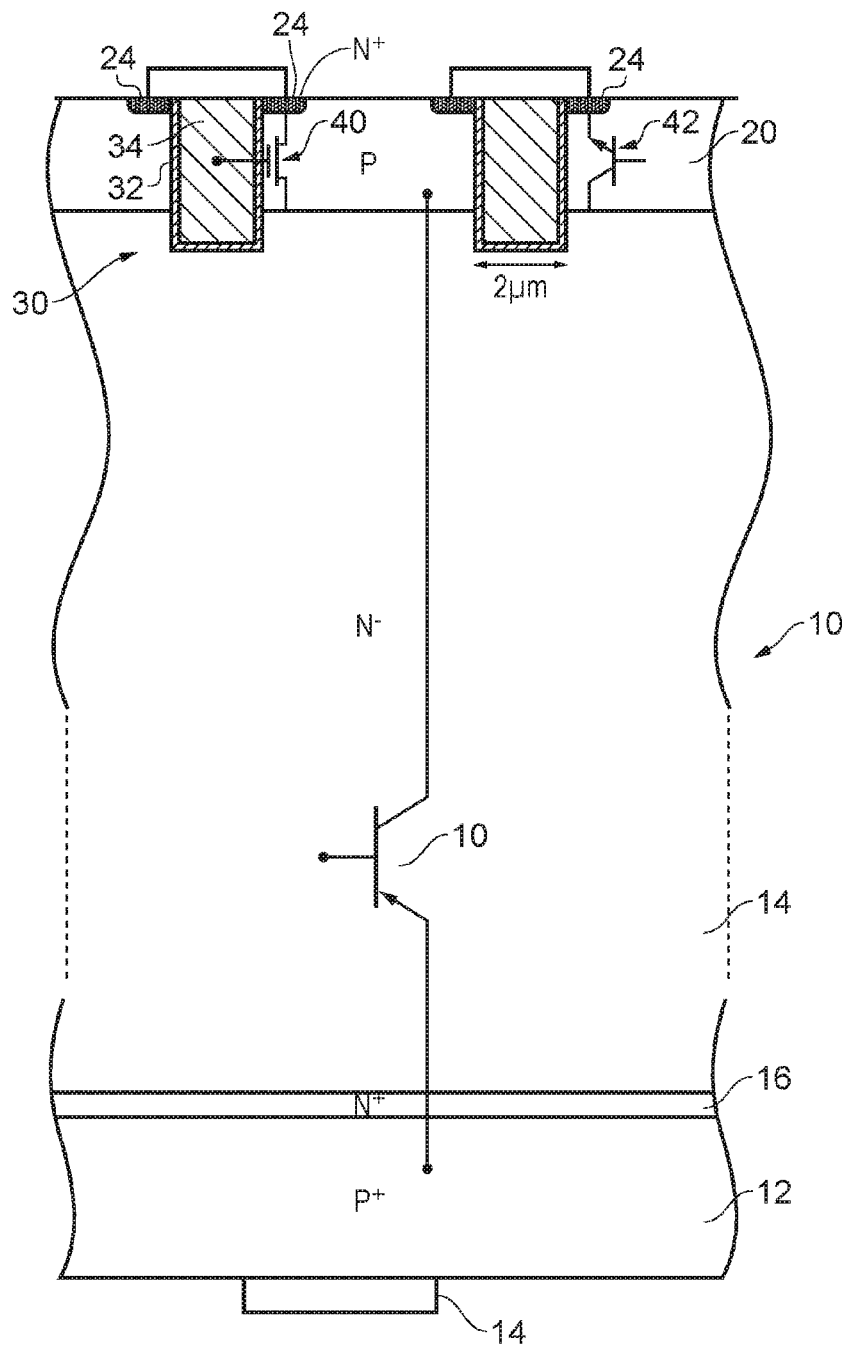
FIG. 3 shows the position of parasitic components within the transistor shown in FIG. 1.
Figure 4:
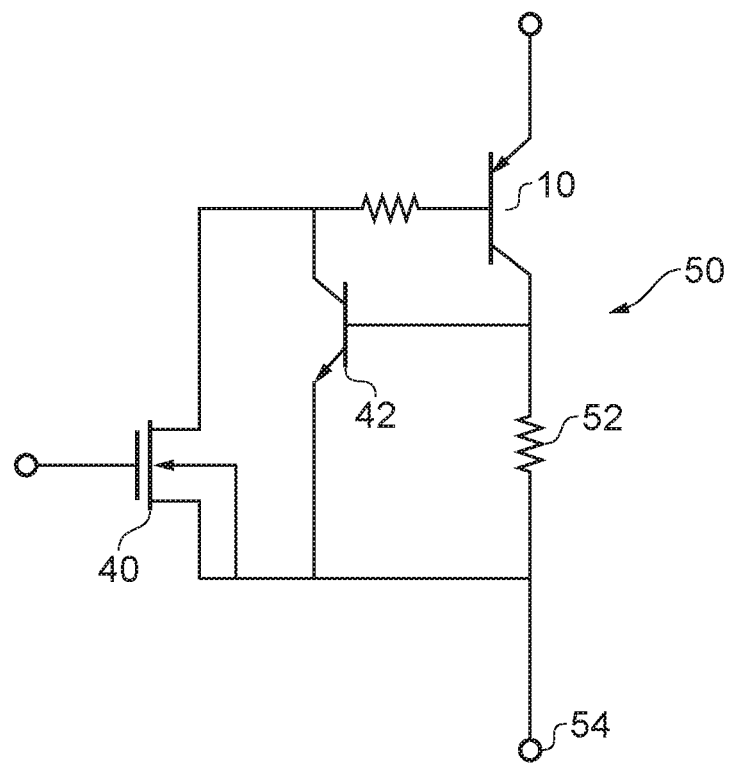
FIG. 4 is an equivalent circuit of the transistor of FIG. 3.

FIG. 3 superimposes the circuit symbol for a drive FET 40 onto the structure shown in FIG. 1 so as to show the effective position of the FET 40 in an IGBT. The position of the PNP transistor is also shown and designated 10. However FIG. 2 also shows that N type region 24, P type region 20 and N type region 14 also form a vertical NPN transistor 42. The vertical NPN transistor is a parasitic component which when included in an equivalent circuit diagram for the structure of FIG. 1, as shown in FIG. 4, illustrates the potential for the PNP transistor 10 to interact with the parasitic NPN transistor 42 to form a parasitic thyristor 50. If the parasitic thyristor 50 switches into a conducting state then control of the IGBT is lost and the device will remain conducting irrespective of the control voltage applied to the gate terminal of the device.

Figure 5:
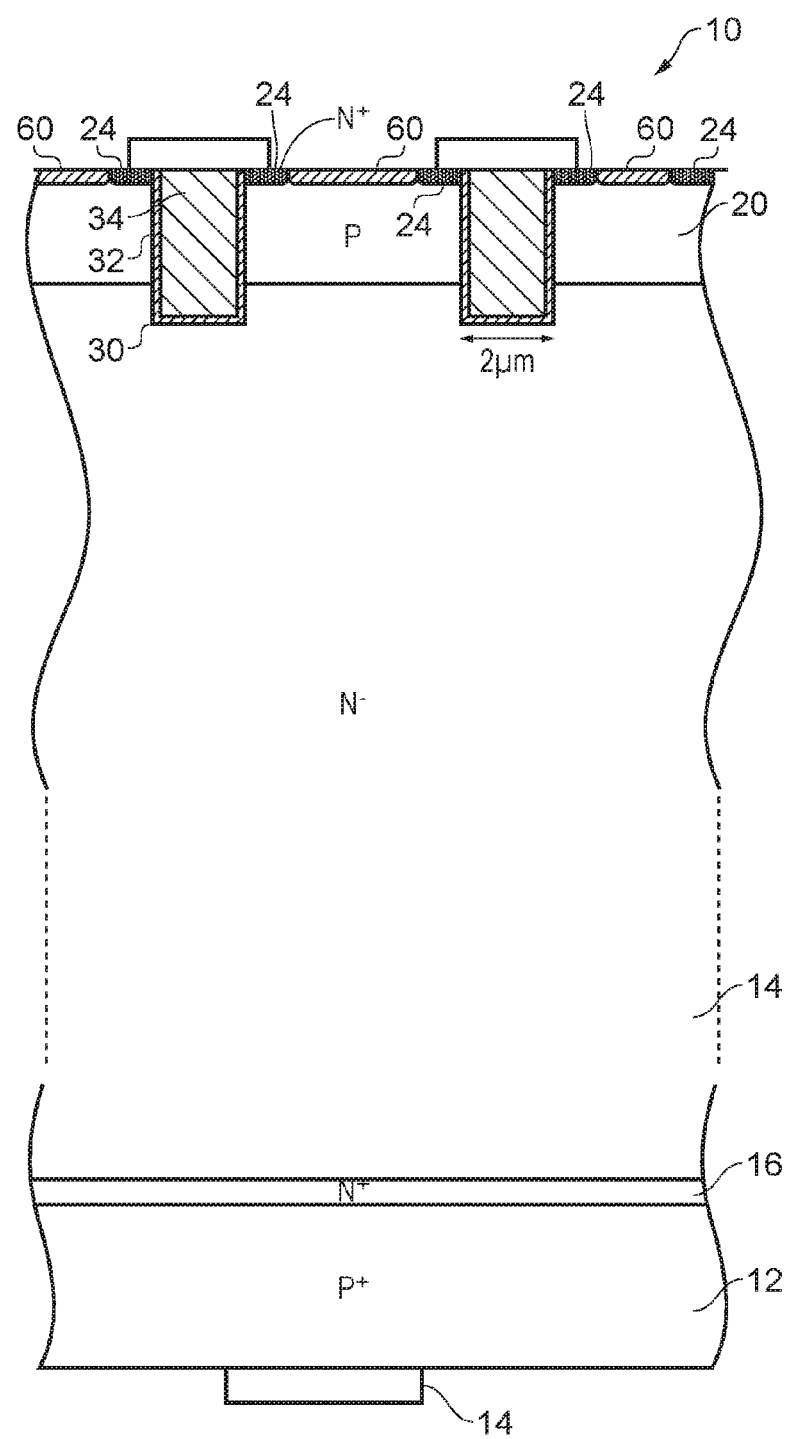
FIG. 5 shows a known modification to the arrangement of FIG. 1 so as to reduce the risk of parasitic components causing the transistor to latch up.

Prior art work on IGBTs has focused on preventing the parasitic thyristor 50 from turning on. This relates to minimizing the resistance of the silicon that forms the parasitic resistor 52 between the base of the parasitic transistor 42 and a device collector node 54. This has been done, as shown in FIG. 5 by making the N type region 24 abut a highly doped P+ type region 60 which forms the collector contact to a metal layer (not shown).

Thus the embedded FET can supply the base current. The IGBT has been a successful device, and the ability to convert the drive signal from a large value current, as would have been required by the PNP bipolar transistor to a gate voltage has significantly benefitted circuit designers.

However the drive FET 40 has to be relatively sizable to supply the large base current. As a result the drive FET of the IGBT has a relatively large gate, which in turn has a relatively large gate capacitance. The consequence of this is that to switch the IGBT on and off quickly (as can be highly desirable to save it and the bipolar device spending time in a high power dissipation regime where the bipolar transistor is passing a large current while being exposed to a large voltage drop) then the gate inrush current may still need to reach several Amperes, albeit for a short duration. Lower current gives rise to slower switching times. The area occupied by the drive FET is sufficiently large that a pattern of trenches can be formed into the P type layer 20 and emitter formed between adjacent trenches. Thus the area lost to forming the trenches can be quite significant, and although the trenches are significant, they by definition, do not contain current carrying material. Thus a significant portion of the surface area of the existing IGBT products is occupied by the drive FET. For a given current capacity this significantly increases the size of the IGBT compared to the size of the equivalent PNP device.

Figure 6:
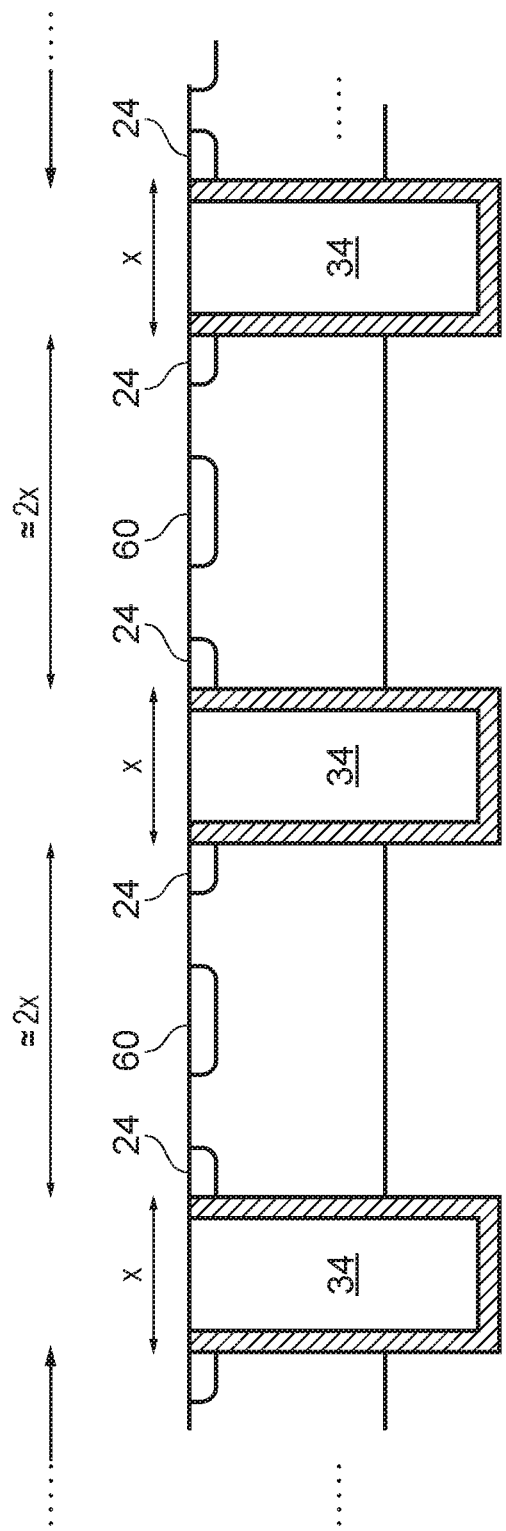
FIG. 6 shows a surface region of an IGBT to scale to illustrate how much space is taken up by the drive FET.

FIG. 6 is drawn substantially to scale to illustrate the surface structure of existing IGBTs. In FIG. 6 each trench takes up a width x, which is typically around 1.2 µm. The trenches are repeated with a period of around 4.5 µm so it can be seen that a more than quarter of the area of the device is lost to the trenches. However the collector regions 60 are around 1 µm wide, and as the size of the collector can limit the maximum device current, it becomes arguable that the existing IGBT is only capable of carrying one quarter of the current that the area of semiconductor allocated to it could handle.

This situation degrades further when guard areas are left around the device to stop adjacent devices being able to set up electrostatic fields that could modify its operation.

Thus the existing IGBT can be quite wasteful of area.

In order to reduce the gate drive current it would be desirable to reduce the gate capacitance. This can be done by making the drive FET smaller, but in turn this reduces the current that can be supplied to the base of the bipolar transistor. The bipolar transistor base current requirement could be reduced by increasing its current gain, but this can cause the break-down voltage to plunge. Thus the IGBT designer is faced with having to trade off gate current against breakdown voltage. As the market for IGBTs is high voltage control, there has been little progress in reducing FET size over the 30 or so years that the IGBT has existed.

A new architecture is provided herein to improve performance of high voltage switching devices.

The inventor has realized that it is possible to inject carriers into a fully depleted region of semiconductor. This wholly counter intuitive observation lead the inventor to develop a device where a bipolar transistor structure is modified to include a series connected FET and where, when the bipolar transistor is off, the FET has a fully depleted region within it. The series connected FET serves to limit the voltage that occurs across the bipolar transistor. This in turn allows a higher gain transistor to be used, with the result that the base current for the drive FET to sustain is reduced, and hence the drive FET can be smaller, and consequently its gate capacitance can be reduced making the device easier to drive. An alternative, but equally valid way of looking at the new device is to regard it as a depletion mode FET where the source region has a doped insertion of an opposite type of doping to the FET. Thus, in an N channel FET, a P type layer is inserted into the channel, the layer cooperating with the N doped regions to form a NPN with the highly doped source region.

It is common when dealing with transistor structures, such as field effect transistors to regard a fully depleted region as not supporting conduction because, for example, use of depleting the channel of a FET is made to turn the device off so as to inhibit current flow between its drain and source regions. However the inventor realized that it would be possible to bias a FET into pinch off so as to drop a large voltage across the FET but still be able to inject carriers into the depleted region such that current could flow through the device. Furthermore the current flow as a result of the carriers causes the FET to turn on such that it no longer drops a large voltage across the region of semiconductor that previously had been depleted, and hence the device is not subject to large amounts of power dissipation because the effective on resistance $R_{ON}$ of the device becomes small.

In an embodiment of the present disclosure a FET is formed in series with a bipolar transistor, in such a way that the collector of the bipolar transistor opens into the channel region of the FET. This FET can be considered as a voltage dropping FET as it serves to reduce the voltage seen by the bipolar transistor from the supply voltage to a pinch off voltage for the voltage dropping FET.

Such a device will be described with respect to FIGS. 7 to 9.

Figure 7:
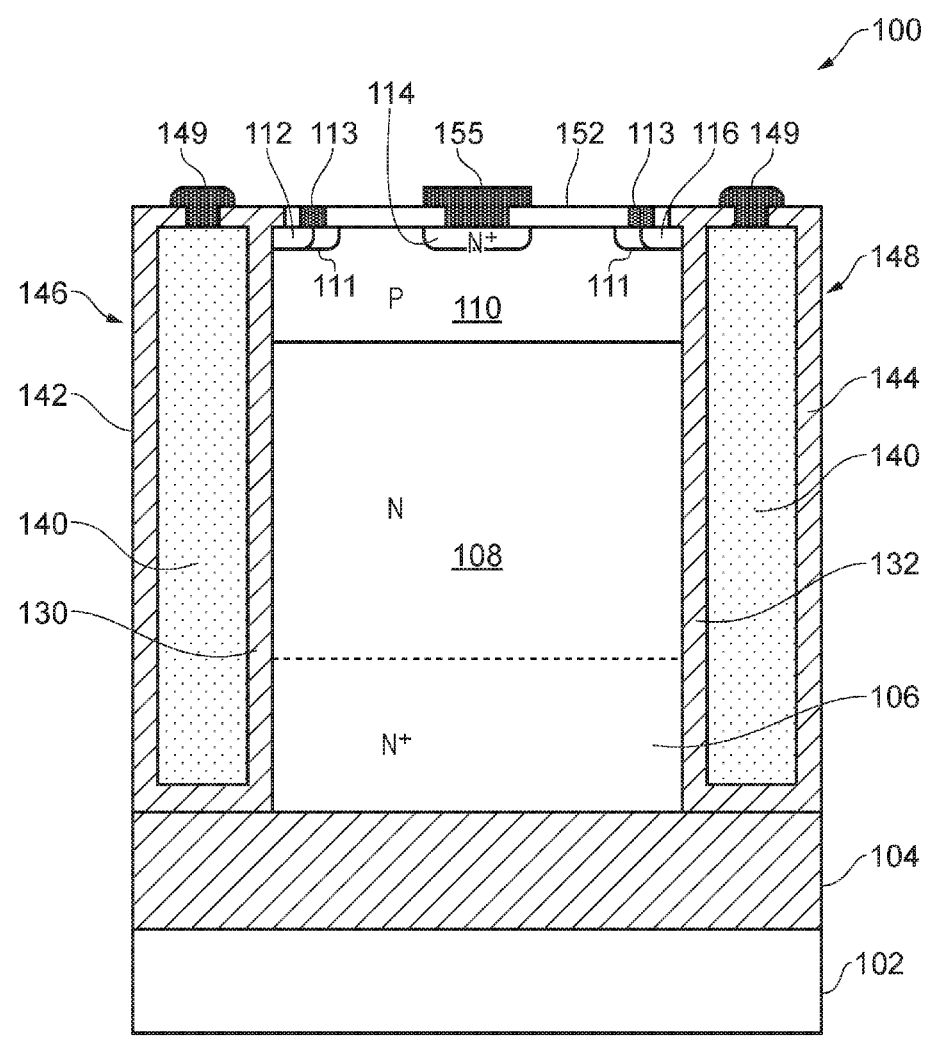
FIG. 7 is a cross section, in a first direction, through a transistor constituting a first embodiment of this disclosure.

FIG. 7 is a cross section through a device fabricated in accordance with this disclosure. The device, generally designated 100, forms a semiconductor switch and to a user behaves as if it were an IGBT.

The device shown in FIG. 7 utilizes silicon-on-insulator, SOI, fabrication techniques to form an isolated well. The principles and advantages discussed herein can be applied to any other suitable semiconductor on insulator technologies. The device shown in FIG. 7 may be part of a larger wafer or die, but for diagrammatic simplicity portions of the wafer beyond the edge of the device have not been illustrated. The wafer comprises a handle wafer 102 over which a dielectric layer 104, for example silicon oxide, is formed. A further layer of silicon is 106 is provided over the oxide layer 104. The layers 102, 104 and 106 generally represent the form in which an SOI wafer is provided by its manufacturer.

The layer 106 is subjected to a doping implantation of donor atoms so as to make the layer 106 into an N type semiconductor. The layer 106 is generally relatively heavily doped, and this heavy doping is designated N+ as known to the person skilled in the art. This makes it relatively highly conducting. An N type epitaxial layer 108 is grown over the layer 106. Layer 108 is less heavily doped than the layer 106. The epitaxial layer can be grown to the upper surface of the device, and the doping changed to an acceptor impurity in order to form a relatively thin P type region 110 above the N type layer 108.

Alternatively the upper portion of the epitaxial layer could be subjected to a further doping step and thermal cycle to form the relatively thin P type region 110. This can give a graded diffusion where the P type doping concentration in the region 110 is greatest at its surface and diminishes with increasing distance from the upper surface of the device. Thus the top surface of the region 110 could be designated P+. Alternatively relatively highly P+ doped regions 111 can be formed in the surface of the P type region 10. Their purpose will be discussed later.

An advantage of stopping the epitaxial grown at the top of the N type layer 108 is that it allows the bulk of the device to be irradiated (if so desired). Irradiation can be used to create defects in the lattice that act as lifetime killers to reduce the minority carrier lifetime, but without damaging the silicon 110 that is used to form the base of the bipolar transistor or the emitter region 114 by virtue of the fact that these regions are not formed until after the optional irradiation step has been performed.

Regions 112, 114 and 116 having a relatively high N type doping concentration are provided at the surface of the device. Such regions can be formed by deposition of a mask, patterning of the mask and selective etching thereof to reveal the regions 112, 114 and 116 for dopant implantation, to create N+ regions.

It can be seen that the vertical structure formed by regions 106, 108, 110, 112, 114 and 116 is bounded by vertically extending insulating walls 130 and 132 which extend from the surface of the device to the dielectric layer 104. The insulating walls 130 and 132 can comprise any suitable dielectric material. These walls serve to delimit the spatial extent of those regions 106, 108, 110, 112, 114 and isolate them from other parts of the wafer, but the walls 130 and 132 also isolate a gate electrode 140 from the regions 106, 108, 110, 112, 114. The gate electrode is bounded by further walls 142 and 144 such that the gate electrode is defined by a conductor, such as metal or doped silicon or doped polysilicon, within trenches 146 and 148. A gate contact 149 is made to the gate 140.

Figure 8:
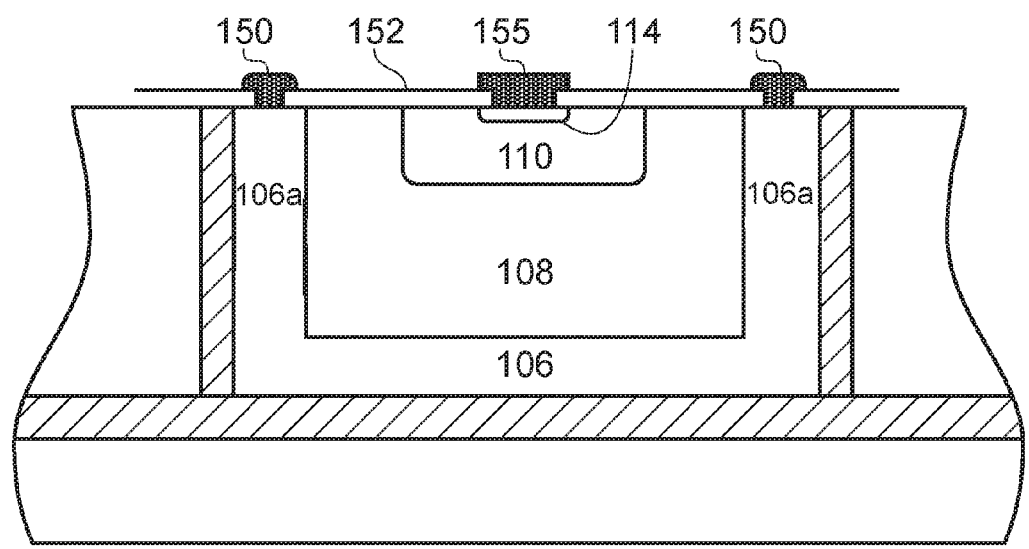
FIG. 8 is a cross section through the bipolar transistor in a second direction perpendicular to the first direction through the first embodiment of this disclosure.

The device shown in FIG. 7 also extends above and below the plane of FIG. 7 and the buried relatively highly doped layer 106 is brought up to surface contacts at either end of the isolated tub of semiconductor by way of relatively highly doped regions 106a, as shown in FIG. 8. The relatively highly doped regions 106a make contact with a conductor 150 which forms a collector/drain of the device. Similarly a metallic contact 155 is formed over the region 114 which functions as an emitter/source of the device. The device is covered with passivation material as layer 152.

Figure 9:
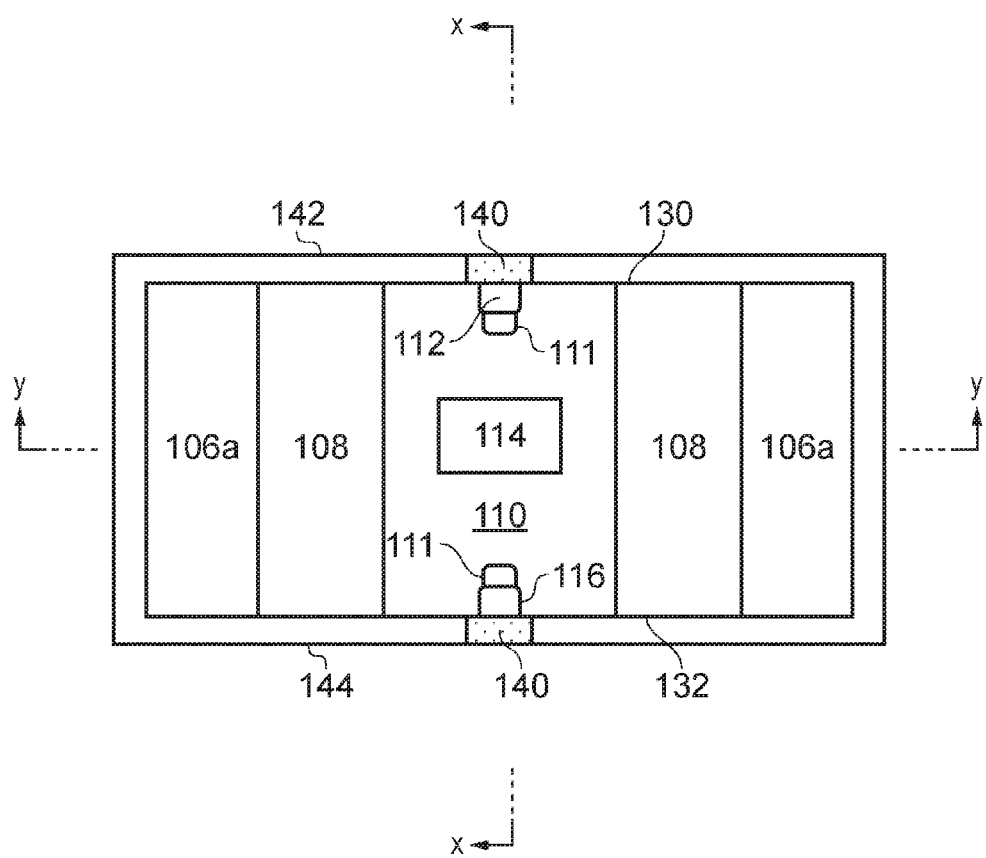
FIG. 9 is a plan view of the surface of the device, without passivation or metal layers being shown.

FIG. 9 is a plan view of the device shown in FIGS. 7 and 8 without the passivation or metal layers being shown. In other variations multiple drive FET implants may be formed.

As shown in FIG. 9, it can be seen that the drive FET regions 112, 116 only take up a relatively small area of the completed device. As such, the area of the gate 140 can become much smaller, in fact β times smaller where β is the gain of the NPN transistor compared to the PNP of the prior art at IGBT device. Since β is often greater than 50 and can be in the range of 100 or more, the gate 140 can be implemented in relatively small areas of the trench that defines the isolating tub for the device. Thus much less area can be consumed by the drive FET compared to the active (current carrying) area of the device than is the case with prior art drive FET structures in prior art IGBTs. This can reduce the footprint on the device, although it will be appreciated that bringing the collector/drain layer 106 back to the surface to make this device compatible with standard fabrication processes offered by semiconductor 'Fabs' uses additional wafer area. Nevertheless the approach used herein can still result in the formation of a high voltage transistor with much reduced drive current to cope with switching between states, and one which can be provided on an integrated circuit and connected to other components by way of contracts all on the same side of the wafer.

FIG. 9 also shows the lines of cross-section for FIGS. 7 and 8. FIG. 7 is a cross-section along line x-x and FIG. 8 is a cross section along line y-y.

Thus, rather than provide a fully vertical transistor as was described with respect to FIG. 5 where a low gain PNP transistor 10 was formed near the surface of the device, we have a higher gain NPN transistor, which offers higher gain for similar dimensions compared to a PNP transistor, and where the NPN transistor is formed in an insulated well with a series FET that can limit the voltage across the NPN transistor when the NPN transistor is non-conducting. As illustrated, the NPN transistor comprises a collector region 108, a base region 110, and an emitter region 114. As also illustrated, the series FET comprises a gate 140, a drain 106, and a source in region 108.

The device of FIGS. 7 and 8 may be formed on a die with a drive transistor located elsewhere on the die so as to emulate IGBT functionality or it may be used as a relatively high gain relatively high voltage bipolar transistor. In which case the regions 112 and 116 may not be formed and connections can be made to the base region 110, optionally by way of highly doped P type regions 111, to provide a way of introducing a base current.

However the structure shown in FIG. 7 has an integrated vertically formed drive FET formed therein so that an IGBT equivalent device is formed, but with higher gain in the bipolar transistor section. This, as discussed before, is achieved by the provision of the doped regions 112 and 116 which replace the P+ region 110 in some parts of the device with an N+ material, and hence can be done at the same time as forming the emitter 114 so this does not incur any additional processing steps. The N+ regions 112 and 116 form the source of the drive FET. The source of the drive FET 215 is connected to the base of the bipolar transistor by virtue of being fabricated within the base region 110 and by being connected to P+ regions 111, for example by a metal contact 113 as shown in FIG. 7. An equivalent circuit is shown in FIG. 10.

Figure 10:
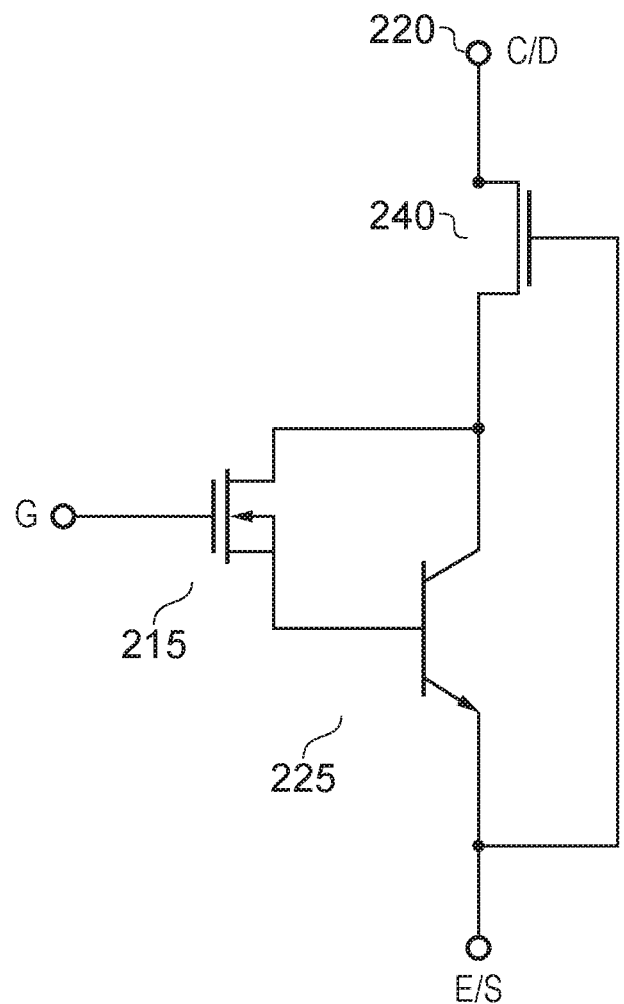
FIG. 10 is an equivalent circuit for the device shown in FIG. 7.

Referring to FIGS. 7 and 10, the N type region 108 of the bipolar transistor also forms the drain of the drive FET 215. In use, the drive FET 215 opens a path for current to flow from the collector region of the bipolar transistor 225, the collector being formed in part by region 108 shown in FIG. 7 through a channel of the drive FET 215 to region 112 and 116, where the current then flows to region 110 and hence to the base 110 of the NPN transistor.

The device looks to the user like an IGBT having a collector C and emitter E and a gate G.

The series FET 240, a MOSFET like structure, and strictly is a poly-oxide-silicon field effect transistor, POSFET, in a preferred embodiment.

The drive FET 215 has its gate formed by the conducting material 140 which is insulated from the regions 106, 108 and 110 of the device by the insulating walls 130 and 132. The gate 140 can be formed in a trench bounded by insulation to isolate the gate, and hence the drive circuits connected to the gate can be protected from the higher voltages that may occur in the transistor device shown in FIG. 7. The voltage of the gate 140 may be raised with respect to the emitter voltage. The forward biased PN junction between the base region 110 and the emitter region 114 stops the base region 110 from becoming more positive than about 0.7 Volts above the emitter voltage in certain embodiments. Taking the gate voltage more positive than that can start to deplete the P type material of the base adjacent the insulating walls 130 and 132, thereby effectively turning that region into an N type region of semiconductor, which can cause a current to flow between the N type region 108 and the N type regions 112/116 by way of the depleted regions. Current arriving at the effective source regions 112 and 116 can then flow into the base region 110 via P+ regions 111 and switch the NPN transistor on.

Figure 11:
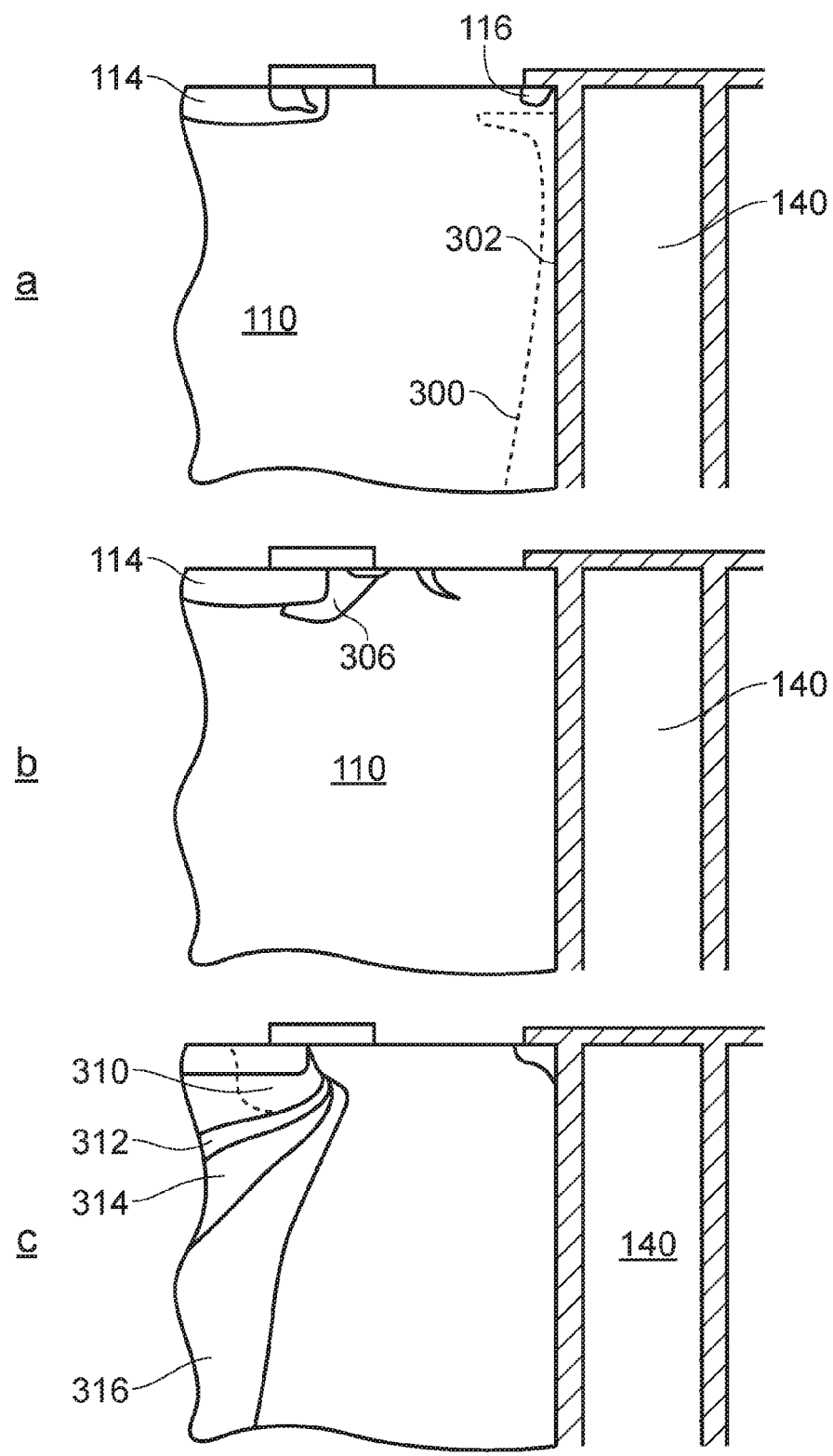
FIG. 11a shows drive FET current flow within the device of FIG. 7.
FIG. 11b shows the distribution of base current, and 11c shows the distribution of emitter current.

FIG. 11a shows part of the device in greater detail and in particular shows the depletion region boundary 300 near the insulating wall and the MOSFET channel current 302 adjacent the wall when the drive FET 215 is conducting. FIG. 11b shows the distribution of the base current, with the greatest current density occurring in region 306 at the corner of the emitter region 114. FIG. 11c shows the emitter current path with region 310 having the highest current density, region 312 having reduced current density but more than region 314, and region 316 having less current density than region 314.

Figure 12:
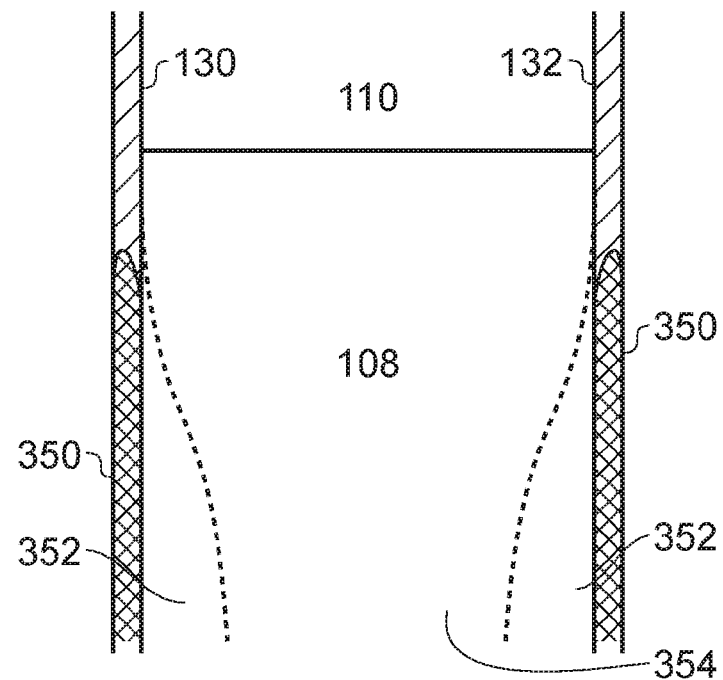
FIG. 12 shows electric field gradients within the FET portion of the device when the FET is in pinch-off.

FIG. 12 schematically illustrates E-field strength within the FET portion of the device. As illustrated, the greatest E-field strength occurs at regions 350 within the dielectric material 130 and 132 of the trench. Much reduced E-field strength occurs in regions 352 and the weakest E-field shown is found in region 354.

Figure 13:
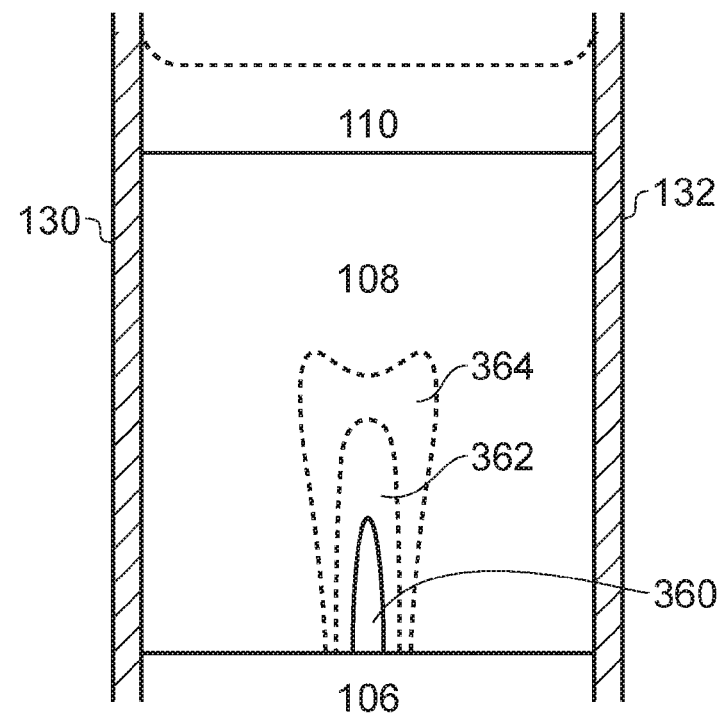
FIG. 13 shows FET current density as a function of position when the device is conducting.

FIG. 13 shows FET current density as a function of position when the device is conducting. As illustrated, the current is largely confined to the center of the device with the greatest current density being in region 360, with progressively reduced current density in regions 362 and 364.

FIGS. 12 and 13 do, however, show that the regions of greatest current flow are separated from the regions of highest E-field, which is good as it makes the device robust against avalanche breakdown mechanisms.

The embodiment described here was for a linear device configuration but other shapes are possible, and devices exhibiting circular or elliptical structures can be formed, as can horizontal devices. Any of the principles and advantages discussed herein can be applied to any suitably shaped device configuration.

As noted before, the series connected FET (240 FIG. 10) should be "pinched off" in order to protect the bipolar transistor (225 FIG. 10). The ability to pinch off the device off depends on the depletion regions extending from each gate electrode being able to extend by more than half the width of the device.

Figure 14:
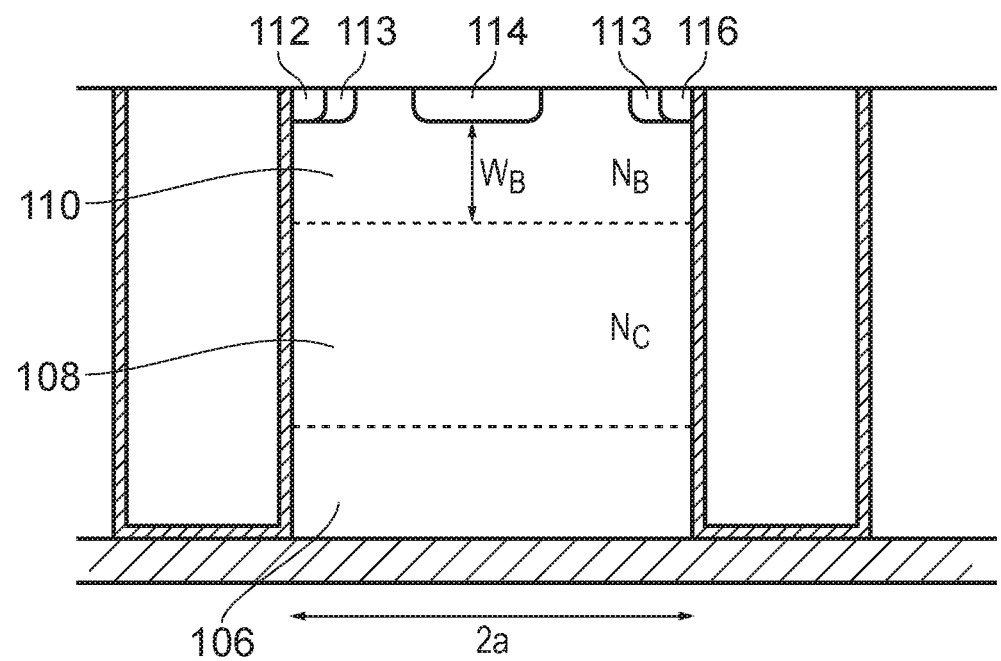
FIG. 14 shows dimensions within the device for the purpose of considering how dimensions and doping control the pinch-off and breakdown voltages.

FIG. 14 shows the device structure with the base depth designated Wb and the distance between the gates designated 2a. The collector doping concentration (in collector region 108) is $N_c$. In general, for good current handling a relatively highly doped collector is desired as $$J_{max} = N_c e V_{sat}$$

Where $J_{max}$ is the maximum current density, e is the charge on an electron and $V_{sat}$ is the saturation voltage for the semiconductor material. $N_c$ is expressed in S.I. units and hence is doping concentration per cubic meter. Hence a doping concentration expressed as $1\times10^{17}$ cm$^{-3}$ would be converted to $1\times10^{23}$ m$^{-3}$ for use in the above equation and in the following equations for $V_p$ and $BV_{ceo}$.

However Nc can also play a part in the pinch off voltage of the series connected FET and also in the breakdown voltage if the bipolar transistor. The pinch off voltage $V_p$ is given by $$V_p = \frac{eN_c(a^2)}{2\varepsilon_{si}}$$

Where a is half the width of the transistor (half the inter-gate distance) and $\varepsilon_{si}$ is the permittivity of the semiconductor, generally silicon. The relative permittivity of silicon is about 11.68.

This increasing Nc increases the pinch off voltage, as does making the device wider.

Turning to the bipolar transistor breakdown voltage, $BV_{ceo}$ can be expressed as $$BV_{ceo} = \frac{\varepsilon_{si} E_{max}}{2eN_c}$$

Where $E_{max}$ is a constant and represents the maximum E field that the material of the device can stand before breaking down and which can be related to a maximum device voltage $V_{max}$ by $$E_{max} = V_{max}/Wb$$

As we typically want pinch off to occur before the bipolar transistor breaks down, we can write $$\frac{eN_c(a^2)}{2\varepsilon_{si}} \leq \frac{\varepsilon_{si} E_{max}}{2eN_c}$$

Figure 15B:
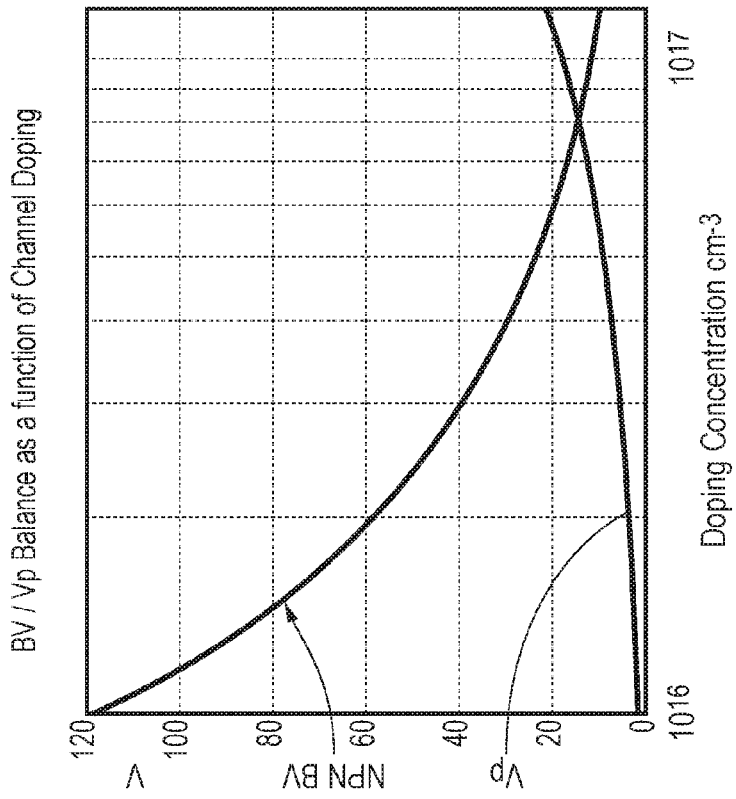
FIGS. 15a and 15b are graphs showing how doping levels interact with current density, and also pinch-off and breakdown voltages.
Figure 15A:
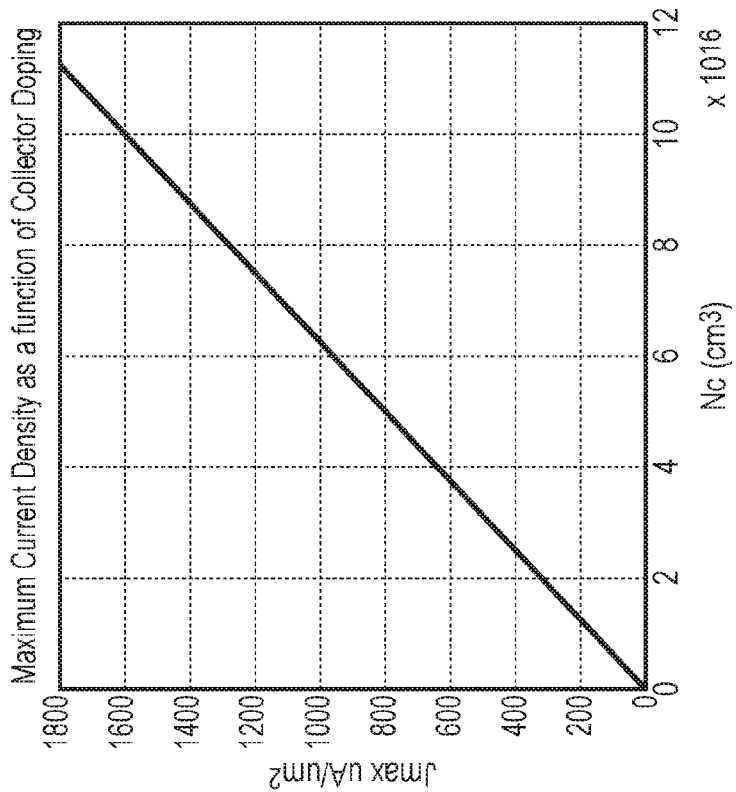

FIGS. 15a and 15b put these equations into context for a device where a is equal to 0.5 microns. However it should be appreciated that other widths of device can be used. The device width and channel doping can be varied, thus a much wider device (say 4 microns) could be arranged to cut off at around 30V with a dopant concentration reduced to $1\times10^{16}$ cm$^{-3}$.

FIG. 15a shows that from a current density perspective, more doping is good but FIG. 15b shows that from a pinch off and breakdown perspective less doping is preferred. However the doping level can be selected to arrive at a pinch off voltage that has a sufficient safety margin over the bipolar transistor breakdown voltage to account for process variations while still providing a good current density. That said, the carrier flow path has, in simulation, been related to the emitter area and hence current density can be traded for higher current carrying capability of the device as a whole by increasing the emitter size, for example by increasing the emitter length along the direction y-y in FIG. 9.

In the Figures the regions 112 and 116 are shown as abutting the insulating walls of the trenches. This need not be the case and the highly doped regions 112 and 116 may be situated away from the insulating walls of the trench (which may facilitate making metal contacts with them to contact with the P+ regions 111) when a less doped N type region can extend to the trench wall from regions 112 and 116.

Figure 16:
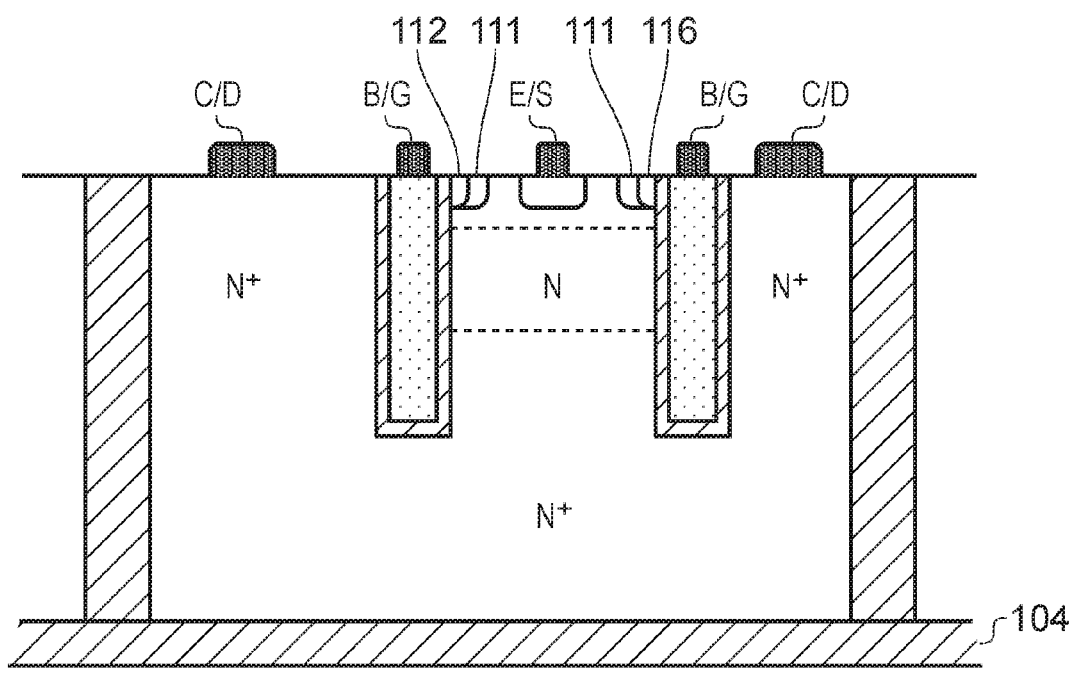
FIG. 16 shows a schematic cross section of a further embodiment of this disclosure.

In the embodiments shown, the trenches that surround the emitter and base have served to define the isolated tub that isolates the current control device of this disclosure from other devices in the wafer. However this need not be the case and the trenches that define the gate may be different from the trenches that define the isolated tub, as shown in FIG. 16, where the trenches defining the gate extend into the N+ layer but not to the bottom most insulating layer 104.

The formation of the relatively smaller drive FET, with its smaller gate in the insulating well means that the parasitic gate capacitance associated with the drive FET 215 should be much smaller than that of a conventional IGBT. As a result transient current flows, i.e. inrush currents, at switching can be much reduced and it becomes easier and less power consuming to drive the device between conducting and non-conducting states.

In summary, a series connected FET is provided to protect a bipolar transistor from excessive voltage, but the bipolar transistor can be used to inject carriers through the channel of the pinched off FET, so as to turn it on. This allows a higher gain bipolar transistor to be used. The bipolar transistor by virtue of its higher gain consumes less gate current for a given device current and hence devices driving the bipolar transistor need not supply so much current. This allows a smaller drive FET to be used, resulting in reduced gate capacitance.

The dopings can be reversed between P type and N type to form a higher gain PNP transistor in conjunction with a FET. The transistor device has been drawn as symmetric in plan view (two degrees of rotational symmetry and two degrees of refection symmetry in the embodiment shown in FIG. 9) but other shapes (linear, race track etc.) are also possible.

The claims presented herein are in single dependency format suitable for use at the USPTO, however it should be assumed that each claim is intended to depend on any preceding claim of the same type except where that is clearly not possible.

Aspects of this disclosure can be implemented in various electronic devices. Examples of the electronic devices can include, but are not limited to, consumer electronic products, parts of the electronic products such as packaged switch components, electronic test equipment, cellular communications infrastructure, etc. Examples of the electronic devices can include, but are not limited to, precision instruments, medical devices, wireless devices, a mobile phone such as a smart phone, a telephone, a television, a computer monitor, a computer, a modem, a hand-held computer, a laptop computer, a tablet computer, a wearable computing device such as a smart watch, a personal digital assistant (PDA), a vehicular electronics system, a microwave, a refrigerator, a vehicular electronics system such as automotive electronics system, a stereo system, a DVD player, a CD player, a digital music player such as an MP3 player, a radio, a camcorder, a camera, a digital camera, a portable memory chip, a washer, a dryer, a washer/dryer, a wrist watch, a clock, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A current flow control device, comprising:
   a bipolar transistor in series combination with a field effect transistor inside an isolated region of semiconductor; and
   a drive field effect transistor having a gate formed within a trench arranged to isolate the gate of the drive field effect transistor from the bipolar transistor.

2. A current flow control device as claimed in claim 1, in which the current flow control device is a three terminal device having a first terminal connected to an emitter region of the bipolar transistor, a second terminal connected to a drain region of the field effect transistor, and a control terminal connected to the gate of the drive field effect transistor to control current flow through the current flow control device, and wherein the three terminals are provided on a same side of the current flow control device.

3. A current flow control device as claimed in claim 1, in which the current flow control device is formed vertically within the isolated region and a drain region of the field effect transistor is formed in a lowermost portion of the current flow control device below a surface of the current flow control device having terminals for connection to the current flow control device.

4. A current flow control device as claimed in claim 3, further including vertical regions doped similar to the drain region and disposed away from an emitter region of the bipolar transistor to enable the drain/collector current to be brought to a surface of the current flow control device for connection to metallic contacts.

5. A current flow control device as claimed in claim 1, in which the bipolar transistor is an NPN transistor having a gain greater than 50.

6. A current flow control device as claimed in claim 1, in which the trench is closed opposite a contact to the gate.

7. A current flow control device as claimed in claim 1, in which the field effect transistor is configured to pinch off when the voltage at a drain region of the field effect transistor exceeds the voltage of at the gate of the drive field effect transistor by a predetermined threshold.

8. A current flow control device as claimed in claim 7, in which the gate of the drive transistor is also within a second trench arranged to isolate the gate of the drive field effect transistor from the bipolar transistor, in which the trench and the second trench are opposing structures, and in which the field effect transistor is formed between the opposing structures so as to define a channel between the opposing structures, and where a pinch-off voltage for the field effect transistor is based on a distance between the opposing structures.

9. A current flow control device as claimed in claim 8, in which the opposing structures are spaced apart by less than 5 microns.

10. A current flow control device as claimed in claim 8, in which the pinch-off voltage for the field effect transistor is based on a collector doping concentration in a region between the opposing structures.

11. An integrated circuit comprising at least one current flow device as claimed in claim 1.

12. A device comprising:
a bipolar transistor;
a first field effect transistor in series with the bipolar transistor;
a second field effect transistor comprising a source electrically connected to a base of the bipolar transistor and a drain electrically connected to a node between the first field effect transistor and the bipolar transistor; and
an insulating well surrounding the bipolar transistor, the first field effect transistor, and the second field effect transistor, wherein the insulating well is configured to insulate the device from other circuit elements disposed on the same die as the device.

13. The device as claimed in claim 12, wherein the first field effect transistor comprises a gate electrically connected to an emitter of the bipolar transistor.

14. The device as claimed in claim 12, wherein a source of the first field effect transistor and a collector of the bipolar transistor each comprise a common region within the insulating well.

15. The device as claimed in claim 12, wherein the bipolar transistor is configured to inject carriers into a depleted region of the first field effect transistor so as to turn the first field effect transistor on.

16. The current flow control device as claimed in claim 1, wherein a conductivity of a channel in the current flow control device is controlled by a signal received at the gate of the drive field effect transistor.

17. A current flow control device, comprising:
a bipolar transistor; and
a field effect transistor in series combination with the bipolar transistor,
wherein the bipolar transistor and the field effect transistor are disposed within an isolated region of semiconductor, and
wherein the bipolar transistor is configured to inject carriers into a depleted region of the field effect transistor so as to turn the field effect transistor on.

18. The current flow control device as claimed in claim 17, further comprising a drive field effect transistor having an isolated gate, the drive field effect transistor being coupled to both the field effect transistor and the bipolar transistor.

19. The current flow control device as claimed in claim 18, further comprising:
a gate terminal disposed on a first side of the current flow control device and connected to the isolated gate of the drive field effect transistor;
an emitter terminal disposed on the first side of the current flow control device and connected to the bipolar transistor; and
a collector terminal disposed on the first side of the current flow control device and connected to the field effect transistor.

20. The current flow control device as claimed in claim 18, wherein a source of the drive transistor is electrically connected to a base of the bipolar transistor.

21. The current flow control device as claimed in claim 17, wherein the field effect transistor comprises a gate formed within a trench arranged to isolate the gate from the bipolar transistor.

* * * * *